United States Patent [19]
Saito

[11] Patent Number: 5,432,481
[45] Date of Patent: Jul. 11, 1995

[54] PHASE-LOCKED LOOP CIRCUIT

[75] Inventor: Toshitada Saito, Kanagawa, Japan

[73] Assignee: Kabushiki Kaisha Toshiba, Kawasaki, Japan

[21] Appl. No.: 344,625

[22] Filed: Nov. 17, 1994

Related U.S. Application Data

[63] Continuation of Ser. No. 51,880, Apr. 26, 1993.

[30] Foreign Application Priority Data

Apr. 27, 1992 [JP] Japan .................................. 4-107877
Apr. 16, 1993 [JP] Japan .................................. 5-089861

[51] Int. Cl.$^6$ ............................................... H03B 27/00
[52] U.S. Cl. ......................................... 331/45; 331/1 R
[58] Field of Search .................. 331/1 R, 45, 18, 25, 331/57, 58, 34, 35, 17; 328/133, 155; 375/120

[56] References Cited

U.S. PATENT DOCUMENTS

| | | | |
|---|---|---|---|
| 4,365,210 | 12/1982 | Harrington et al. | 331/1 A |
| 4,593,254 | 6/1986 | Coburn | 331/1 A |
| 4,843,469 | 6/1989 | Boyce | 358/148 |
| 5,136,253 | 8/1992 | Ueno | 328/133 |
| 5,166,644 | 11/1992 | Saito et al. | 331/17 |
| 5,192,915 | 3/1993 | Mathieu et al. | 328/133 |
| 5,208,546 | 5/1993 | Nagaraj et al. | 328/155 |
| 5,220,294 | 6/1993 | Ichikawa | 331/17 |
| 5,233,316 | 8/1993 | Yamada et al. | 331/45 |
| 5,256,989 | 10/1993 | Parker et al. | 331/1 A |
| 5,276,716 | 1/1994 | Winen | 375/120 |

FOREIGN PATENT DOCUMENTS

| | | | |
|---|---|---|---|
| 0355466 | 2/1990 | European Pat. Off. | 331/1 A |
| 0416840 | 3/1991 | European Pat. Off. | 331/1 A |
| 2194714 | 3/1988 | United Kingdom | 331/1 A |

*Primary Examiner*—Raymond A. Nelli
*Attorney, Agent, or Firm*—Foley & Lardner

[57] ABSTRACT

A phase-locked loop circuit, which is used in order to extract a clock signal out of a received signal obtained from a token ring network or various LANs, has a phase comparator, a charge pump, and a voltage controlled oscillator. Said phase comparator has a window signal generating means, an edge extracting means, and a control means. This edge extracting means finds the edge existence in a received signal during the open period of said window signal. Therefore, if the center edge of the signal has a phase jitter within the open period, the extracting means can find the center edge. When the extracting means finds no edge, said control means shifts the window position by a certain bit time, so as to restart the new extracting of center edge. Thus, this circuit can recover to the synchronous state without causing a bit slip even when a center edge is lost.

12 Claims, 15 Drawing Sheets

PHASE-LOCKED LOOP CIRCUIT

This application is a continuation of application Ser. No. 08/051,880, filed Apr. 26, 1993.

BACKGROUND OF THE INVENTION

1. Field of the Invention

This invention relates to a phase-locked loop circuit which extracts a clock signal out of a received signal obtained from a token ring network using a differential Manchester code or from various local area networks (LAN) using Manchester code. In particular, this invention relates to a phase-locked loop circuit which is capable of extracting a clock signal out of a received signal having any data pattern at a stable follow-up speed, and smoothly recovering to a synchronous state without causing a bit slip even in the case where a center edge is lost. This invention also relates to a phase-looked loop circuit which is capable of detecting a period in which no received signal is found, thus evading a big shift of the synchronizing frequency of this phase-locked loop circuit, the shift which arises within said period, and thus quickly recovering to said synchronous state once a received signal is again found.

2. Description of Prior Arts

A prior art phase-locked loop circuit (referred to as PLL, below) includes a phase comparator 51, a charge pump 53, and a voltage controlled oscillator (referred to as VCO, below) 55, as shown in FIG. 14.

In this circuit arrangement, phase comparator 51 detects the phase difference between a received data signal "DATA" and a clock signal "Clock" generated by VCO 55. A current having a magnitude corresponding to the phase difference detected by comparator 51 is applied to charge pump 53 so as to change the control voltage for VCO 55. When the phase of clock signal "Clock" is behind that of data signal "DATA", charge pump 53 is operated to increase the oscillating frequency of VCO 55, so that VCO 55 catches up to the data signal.

Manchester code is a modulation system in which an information signal and clock signal "Clock" are combined into received signal "DATA". This code has two modes, one of which has two edges in one bit time and the other has only one edge.

FIG. 2a shows how Manchester code is synthesized from data signal "DATA" and clock signal "Clock". In order to produce a differential Manchester code, differential-encoding is applied first to the data, and then, the resulting data signal is converted into Manchester code. Therefore, both codes basically have the same characteristics with each other. Phase information required by a PLL is taken from the respective edge positions of a data signal. In Manchester code, the edge frequency varies depending on the data pattern of a received data signal.

In the prior art PLL shown in FIG. 15, a phase comparison is carried out so as to drive charge pump 53 only when a rising edge is detected. In this case, however, the edge generation rate is not constant. Thus, the generating position of edges cannot be predicted. In this circuit, therefore, charge pump 53 is driven after having detected a rising edge in a received signal.

FIG. 16 is a timing chart for explaining the operation of the circuit shown in FIG. 15. Flip flop Q10 detects the rising edge of data signal "DATA". Flip flop Q11 detects the rising edge of clock signal 2CLK which is obtained from VCO 55 and has a frequency two times as high as that of the clock component in the received data signal. From the time when flip flop Q10 detects the rising edge of data signal "DATA" to the time when flip flop Q11 detects the rising edge of clock signal 2CLK, current source I10 supplies charge pump 53 with charging pulses. While clock signal 2CLK is in an active state, flip flop Q11 keeps its set state, and therefore, flip flop Q10 is reset by this set signal. Then, operation switch SW10 is turned off to stop the generation of charging pulse. During the set state of flip flop Q11, current source I11 generates discharging pulses. Once clock signal 2CLK comes into an in-active state, flip flop Q11 is reset by flip flop Q10, thus making switch SW11, which has been operated to generate discharging pulses, off.

As is evident from the first pulse of received data signal "DATA" shown in FIG. 16, when no phase difference exists between data signal "DATA" and clock signal 2CLK, a balance is kept between the charging and discharging pulses. Therefore, the amount of resulting charge in the charge pump does not vary at the end of an operation. And thus, the control voltage for VCO 55 does not vary. On the other hand, if the phase of data signal "DATA" precedes that of clock signal 2CLK, the charging pulses are generated longer in time, thus increasing the amount of stored charge in charge pump 53. The control voltage for VCO 55 becomes higher so as to increase the oscillating frequency. Thus, the phase delay in the clock signal will be recovered. On the contrary, when the phase of clock signal 2CLK precedes that of the data signal, the control voltage for VCO 55 becomes lower in magnitude, thus decreasing the oscillating frequency.

In the prior art PLL as explained above, phase comparator 51 detects the time difference between the rising edge positions of data signal "DATA" and clock signal 2CLK from VCO 55. According to the detected result, comparator 51 outputs pulse signals for switching the current sources which supply charge pump 53 with a charging or discharging current.

As explained above, in said PLL, a pair of charging and discharging pulses are always generated at every phase comparison. Thus, a triangular pulse component is always included in the control voltage for VCO 55. This component is disadvantageous because it unstabilizes the VCO 55 operation.

In addition, the frequency of phase comparison varies due to the differences in data patterns. Thus, the follow-up speed of a PLL circuit varies due to the differences in data patterns.

Still in addition, in a token ring communication system, signals are sometimes not sent on the ring for a certain period when a node is added onto the ring. At this moment or the after, in order to recover to the synchronous state, the follow-up operation of the PLL should be carried out smoothly. In the prior art PLL, however, the lack of center edge is continuously detected during said period in which no received signal is sent. In this case, the charge pump repeats the operation for compensating the lack of center edge. Therefore, the accumulated voltage in a loop filter connected to the charge pump gradually varies. As a result, when a received signal is found again, it is difficult for the PLL to smoothly recover to the original synchronous state.

SUMMARY OF THE INVENTION

This invention has been made to overcome the above mentioned problems of the prior art PLL.

Therefore, one objective of the present invention is to provide a phase-locked loop circuit which is capable of extracting a clock component out of a received signal at a stable follow-up speed for all data patterns.

Another objective of the present invention is to provide a phase-locked loop circuit which is capable of smoothly recovering to a synchronous state without causing a bit slip even in the case where a center edge is lost.

The other objective of the present invention is to provide a phase-locked loop circuit which is capable of detecting a period in which no received signal is found, thus evading a big shift of the synchronizing frequency of this phase-locked loop circuit, the shift which arises during said period, and thus quickly recovering to said synchronous state once a received signal is again found.

In order to realize said objectives, the first feature of the present invention provides a phase locked loop circuit which is comprised of the following as shown in FIG. 1: a phase comparator 1 for detecting the phase difference between a received data signal "DATA" and a clock signal "Clock" which is obtained from a voltage controlled oscillator 5 described below; a charge pump 3 for outputting a control voltage having a magnitude corresponding to the phase difference detected by the phase comparator 1; and the voltage controlled oscillator 5 for producing the clock signal "Clock" according to the control voltage. The phase comparator 1 is comprised of means 13 for generating a window signal "Window'" which opens during a certain period of every one of the information bits of the data signal "DATA", and means 11 for extracting an edge of the data signal "DATA" during the open period of the signal "Window'".

The second feature of the present invention provides a phase-locked loop circuit which is comprised of the following as shown in FIG. 8: a phase comparator 1' for detecting the phase difference between a received data signal "DATA" and a clock signal "Clock" which is obtained from a voltage controlled oscillator 5 described below; a charge pump 3 for outputting a control voltage having a magnitude corresponding to the phase difference detected by the phase comparator 1'; and the voltage controlled oscillator 5 for producing the clock signal "Clock" according to the control voltage; wherein the phase comparator 1' is comprised of means 13' for generating a window signal "Window" which opens during a certain period of every one of the information bit of the data signal "DATA", means 11 for extracting an edge of the data signal "DATA" during the open period of the signal "Window", means 22 for detecting whether an edge arises or not according to the detected result of said edge extracting means 11, means 23 for producing a pulse signal "CORRECT" which compensates the operation of the charge pump 3 when the lack of center edge is detected by the lack of edge detecting means 22, a lack of edge counter 25 for calculating the number of continuous lack of edge detected by the detecting means 22, and means G5 to G7 for stopping the operation of this phase comparator 1', when the value in said counter 25 reaches a certain value and until a new edge is found.

The third feature of the present invention provides a phase-locked loop circuit which is comprised of the following as shown in FIG. 11: a phase comparator 1" for detecting the phase difference between a received data signal "DATA" and a clock signal "Clock" which is obtained from a voltage controlled oscillator 5 described below; a charge pump 3 for outputting a control voltage having a magnitude corresponding to the phase difference detected by the phase comparator 1"; and the voltage controlled oscillator 5 for producing the clock signal "Clock" according to the control voltage. Phase comparator 1" is comprised of means 13' for generating a window signal "Window" which opens during a certain period of every one of the information bits of the data signal "DATA", means 11 for extracting an edge of the data signal "DATA" during the open period of the signal "Window", means 22 for detecting whether an edge arises or not according to the detected result of the edge extracting means 11, means 23 for producing a pulse signal "CORRECT" which compensates the operation of the charge pump 3 when the lack of center edge is detected by the lack of edge detecting means 22, a lack of edge counter 25 for calculating the number of continuous lack of edge detected by the detecting means 22, and selecting means 27 for switching the input signal of this phase comparator 1" into a signal X'tal having a predetermined oscillating frequency.

The fourth feature of the present invention provides the phase-locked loop circuit having the first, second, or third feature, wherein the open period of the signal "Window" or "Window'" is from the first to the third quarter of every one of the information bit of said received data signal "DATA".

The fifth feature of the present invention provides the phase-locked loop circuit having the first, second, third, or fourth feature, wherein the phase-locked loop circuit detects the center edge by setting an open period in the signal "Window'" or "Window".

The sixth feature of the present invention provides the phase-locked loop circuit having said first, second, third, fourth, or fifth feature, wherein the phase-locked loop circuit has means 15 which detects whether an edge arises or not according to the result from the edge extracting means 11, and shifts the open period of said signal "Window'" by a half time of one bit.

The seventh feature of the present invention provides the phase-locked loop circuit having the third, fourth, fifth, or sixth feature, wherein the phase-locked loop circuit has stop control means G8 which stops outputting signal "CORRECT" from pulse generating means 23 for compensating the operation, and stops shifting the open period of said signal "Window" by a half time of one bit.

The eighth feature of the present invention provides the phase-locked loop circuit having the first, second, third, fourth, fifth, sixth, or seventh feature, wherein the charge pump 3 has a first current source I2 for charging this pump 3, a second current source I3 for discharging this pump 3, and a third current source I1 for correcting the discharge current by the second current source I3 according to the detected result "UP" from said edge extracting means 11.

The ninth feature of the present invention provides the phase-locked loop circuit having the first, second, third, fourth, fifth, sixth, seventh, or eighth feature, wherein the charge pump 3 has a first switch SW2 connected to the first current source I2 and a second switch SW3 connected to the second current source I3, and these switches SW2 and SW3 are operated to be (off, off), (on, off), (on, on), and (off, off), or (off, off), (off, on), (on, on), and (off, off) in turn.

The tenth feature of the present invention provides the phase-locked loop circuit having the first, second, third, fourth, fifth, sixth, seventh, eighth, or ninth feature, wherein the received data signal "DATA" is composed of a differential Manchester code.

In the phase-locked loop circuit according to the first, fourth, fifth, sixth, eighth, ninth, or tenth feature, as shown in FIG. 1, phase comparator 1 detects the phase difference between the received data signal "DATA" and the clock signal "Clock" generated by voltage controlled oscillator (VCO) 5. According to the detected phase difference, charge pump 3 outputs a control voltage, which has a magnitude corresponding to the detected phase difference, into VCO 5 so as to generate clock signal "clock" from VCO 5. In phase comparator 1, means 13 generates a window signal "Window'" which opens during a time period from the first quarter to the third quarter of every one of the information bits of received data signal "DATA". Means 11 extracts an edge of the received data signal "DATA" during the open period of the signal "Window'". According to this extracted result obtained from means 11, control means 15 shifts the open period of the signal "Window'" by a half of the time of one bit.

In FIG. 2a, the process is shown how the Manchester code is synthesized from received data signal "DATA" and clock signal "Clock" obtained from VCO 5. As shown in this figure, the Manchester code always contains a center edge at every half bit time because this code includes a component of clock signal "Clock".

FIG. 2b shows how the window is opened during a time period from the first quarter to the third quarter of one bit time, in order to extract the center edge. In this invention, the center edge is extracted using said window, so that the center edge having a phase jitter arising within the first to the third quarter of one bit time can always be extracted.

In a token ring network, the gap between frames should be filled with filler signals. In the case where the number of filler signals used for filling the gap becomes a multiple of an odd number of a half bit time, the position of the center edge shifts. In addition, signals SD and ED, which show the beginning and the end of a frame, sometimes do not contain the center edge.

In these occasions, the center edge does not arise within the window, and therefore, this situation is considered to be the lack of an edge. As a result, the phase comparison between a received data signal and a clock signal can't be carried out. In this invention, therefore, when this fact is detected by means for detecting the lack of a center edge, the window position is shifted by a half of the time of one bit so as to carry out a new extraction of a center edge.

Charge pump 3 is charged up with the first current source I2 or discharged with the second current source I3 by the amount corresponding to the time difference between the expected time of the center edge, which is obtained from the clock signal "Clock" supplied by VCO 5, and the actual time of center edge extracted from the data signal. When no center edge is found within the window period, only discharge is carried out. Then, a correcting current is produced by the third current source I1 so as to compensate the discharge.

The charge or discharge period for charge pump 3 becomes longer in response to the amount of phase shift. Therefore, when the phase-locked loop circuit is in a synchronous state, the charge or discharge is carried out only for a very short time. If the signal, which controls the current sources to be on or off so as to charge or discharge the pump, is made from the phase difference, the pulse width of this signal is too short to carry out a stable operation.

In this invention, accordingly, the first switch SW2 connected to the first current source I2 and the second switch SW3 connected to the second current source I3 are operated respectively to be (off, off), (on, off), (on, on), and (off, off), or (off, off), (off, on), (on, on), and (off, off) in turn. As a result, the on-times of switch SW2 and switch SW3 become longer, thus stabilizing the operation of current sources. When current sources I2 and I3 are both on, the inflow and outflow of current for charge pump 3 should be controlled to balance, so as not to increase or decrease the accumulated charges, as is the case where switches SW2 and SW3 are both off.

In a token ring network, a starting delimiter signal SD and a ending delimiter signal ED are defined in order to discriminate the beginning and the ending of a frame from a signal having no center edge. Because of these signals SD and ED, control means (15) can effectively detect the lack of a center edge, and thus compensate the operation of charge pump 3 according to the detected result. In this case, if the received data signal is interrupted for a short time, control means 15 maintains the voltage in charge pump 3, so that the oscillating frequency from voltage controlled oscillator 5 does not change extremely.

In a token ring network, a new station can be inserted into the ring, even in the case where the network is under operation. Also, a station can be disconnected from the token ring network under operation. In these occasions, a circuit switching is carried out using a relay at a connecting point between the ring and the station. During the certain period in which said operation for circuit switching is carried out, a time zone having no signal on the ring arises. During this time zone, phase comparator 1 in the phase-locked loop circuit continuously detects the lack of center edge.

In the phase-locked loop circuit having said first feature of this invention, means for compensating the wrong operation of charge pump 3 due to the lack of center edge, that is, control means 15, prevents a large voltage shift in VCO 5, which may arise in a very short time. However, when this situation continues, the voltage shift in VCO 5 can't be ignored. The reason for this is as follows. The discharge current for charge pump 3 produced by phase comparator 1 is technically difficult to precisely coincide with the charging current for charge pump 3 produced by control means 15. Therefore, when the compensating operation continues for a long time, the voltage for VCO 5 shifts by a large amount.

Accordingly, if the lack of center edge continuously occurs a predetermined number of times, this situation is considered that signals on the ring are interrupted due to said switching of the relay. In this case, therefore, the voltage variation in VCO 5 should be controlled. In the phase-locked loop circuit having the second, fourth, fifth, sixth, eighth, ninth, or tenth feature, the voltage variation is controlled by stopping the operation of phase comparator 1 itself, thus ceasing the charge or discharge by pump 3 for the loop filter.

In the phase-locked loop circuit having the second, fourth, fifth, sixth, eighth, ninth, or tenth feature of this invention, as shown in FIG. 8, phase comparator 1' detects the phase difference between received data signal "DATA" and clock signal "Clock" from VCO 5. Charge pump 3 outputs a control voltage having a magnitude corresponding to said phase difference detected by phase comparator 1'. Then, VCO 5 produces clock signal "Clock" according to said control voltage. On the other hand, window signal generating means 13' contained in phase comparator 1' produces signal "Window" which opens during from the first quarter to the third quarter of every one information bit of received data signal "DATA". Means 11 extracts an edge of received data signal "DATA" during said open period of signal "Window". Then, means 22 detects whether an edge exists or not according to the result of said means 11. In the case where the lack of edge is found, compensating pulse generating means 23 produces signal "CORRECT" in order to correct the wrong operation of charge pump 3. In addition, lack of edge counter 25 calculates the detected number of continuous lack of edge obtained from lack of edge detecting means 22. When this number reaches to a predetermined value, means G5–G7 stop the operation of phase comparator 1' until a new edge is found.

According to the above mentioned operation, the voltage variation in VCO 5 can be controlled, so that the time, which is required for recovering to the synchronous state once a Manchester signal is received again, becomes shorter.

In the phase-locked loop circuit having the third, fourth, fifth, sixth, seventh, eighth, ninth, or tenth feature of this invention, a signal X'tal is input to phase comparator 1 instead of the received signal "DATA", in order to control the voltage variation in VCO 5, which arises when the lack of center edge is found a predetermined number of times. Signal X'tal has the frequency which is the target of this oscillator 5. As a result, the oscillating frequency in VCO 5 is fixed to that of signal X'tal.

In the phase-locked loop circuit having the third, fourth, fifth, seventh, eighth, or ninth feature of this invention, as shown in FIG. 11, phase comparator 1' detects the phase difference between received data signal DATA "and clock signal "Clock" from VCO 5. Charge pump 3 outputs a control voltage having a magnitude corresponding to the detected phase difference so as to produce clock signal "Clock" from VCO 5. Window signal generating means 13' contained in phase comparator 1' produces signal Window" which opens during from the first quarter to the third quarter of every one information bit time. Means 11 extracts an edge of received data signal "DATA" during said open period of signal "Window". According to this result from means 11, means 22 finds whether an edge exists or not. When the lack of edge is found, means 23 supplies charge pump 3 with signal "CORRECT" in order to correct the wrong operation. In addition, lack of edge counter 25 calculates the detection number of continuous lack of edges. When this number reaches to a certain value, selecting means 27 switches over the input signal of comparator 1' to signal X'tal which has a predetermined value of frequency, until a new edge is found.

As a result, the voltage variation in VCO 5 can effectively be controlled so that the time, which is required to recover to a synchronous state once a Manchester signal is received again, becomes shorter.

These and other objectives, features, and advantages of the present invention will be more apparent from the following detailed description of preferred embodiment in conjunction with the accompanying drawings.

BRIEF DESCRIPTION OF DRAWINGS

FIG. 18 is a timing chart for explaining the operation of the prior art phase-locked loop circuit.

DETAILED DESCRIPTION OF PREFERRED EMBODIMENT

Figure 1:
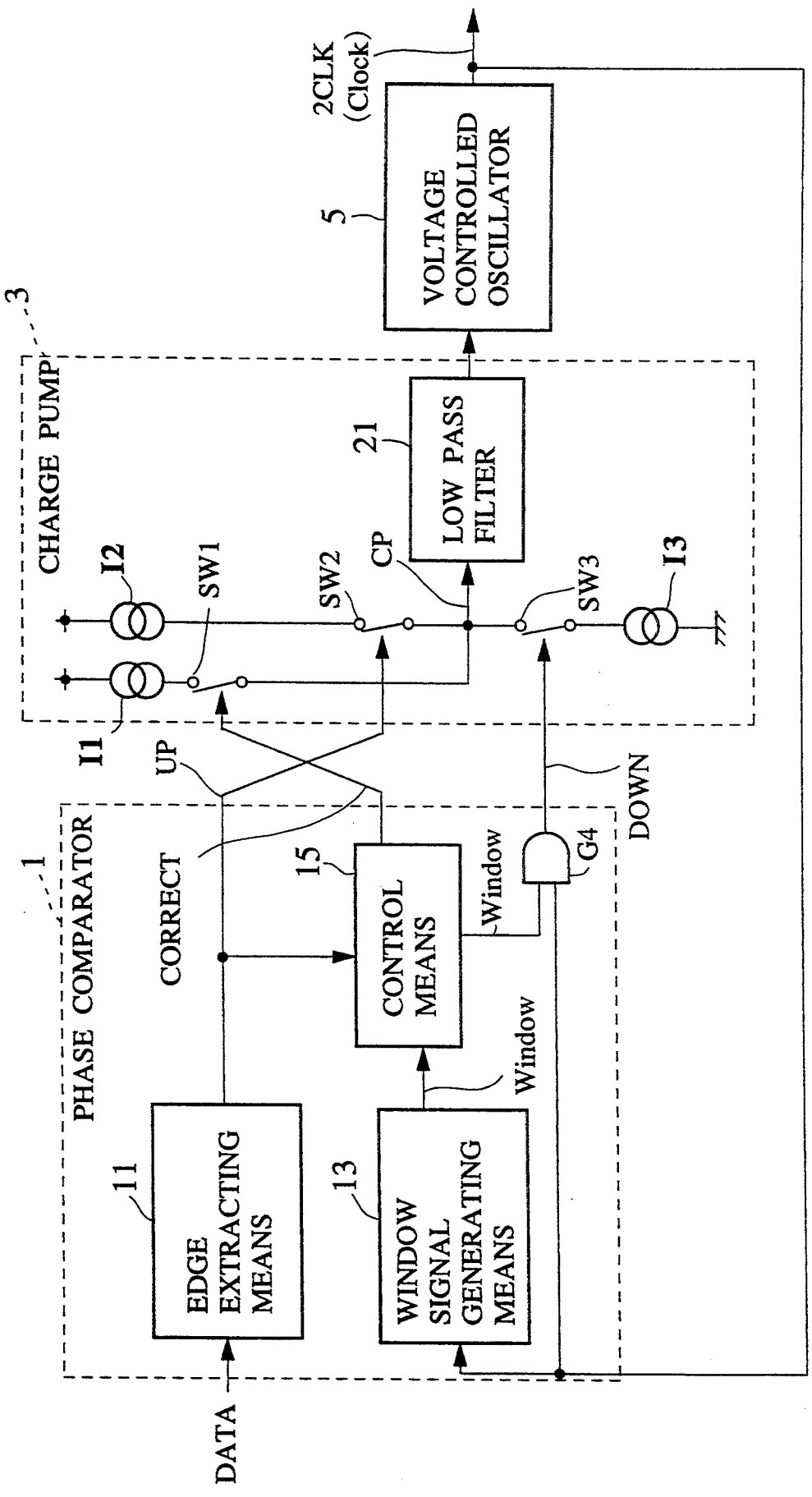
FIG. 1 is a circuit diagram showing the structure of a phase-locked loop circuit according to the first embodiment of the present invention.
Figure 2A:
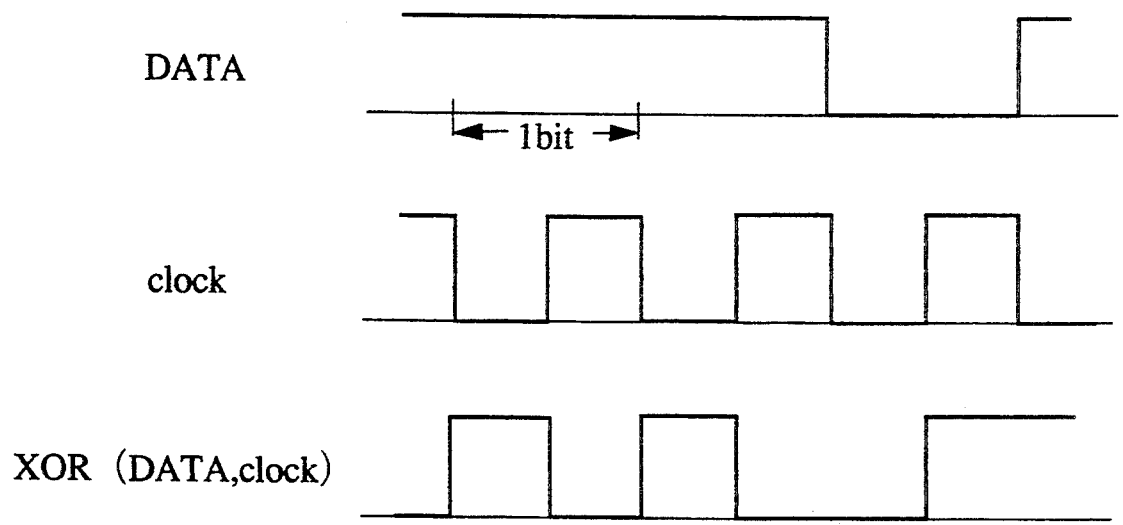
FIG. 2a is a wave chart showing a Manchester code signal which is obtained by combining data with a clock signal.
Figure 2B:
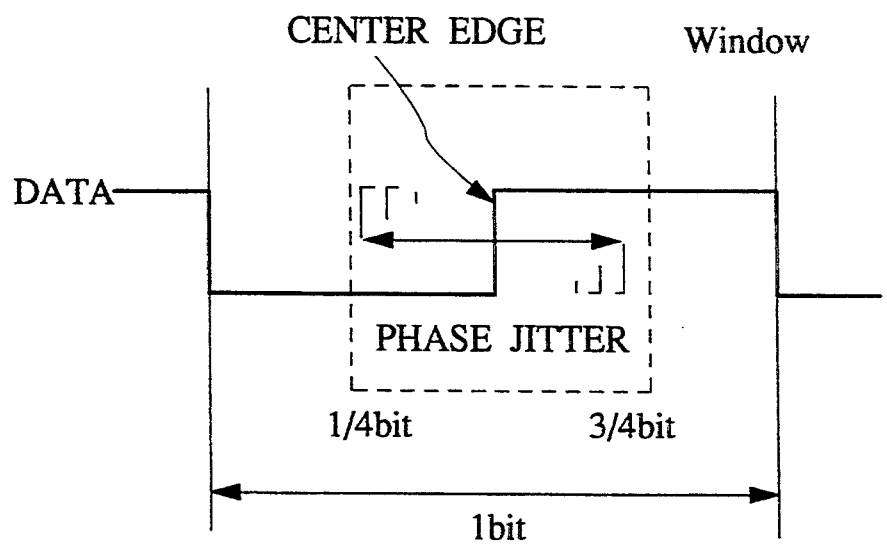
FIG. 2b is a view showing a window period for explaining the positions of a window signal and a center edge in one bit time.

FIG. 1 shows the structure of a phase-locked loop circuit (PLL) according to the first embodiment of the present invention.

As shown in this figure, the PLL circuit of this embodiment is comprised of the following: a phase comparator 1 which detects the phase difference between a received data signal "DATA" and a clock signal "Clock" obtained from a voltage controlled oscillator 5; a charge pump 3 which outputs a control voltage having a magnitude corresponding to the detected phase difference by phase comparator 1; and the voltage controlled oscillator (VCO) 5 which generates said clock signal in response to said control voltage.

In FIG. 1, signal "DATA" is composed of differential Manchester code received from a token ring. Signal "2CLK" represents a signal oscillated in VCO 5 and has a frequency two times higher than that of the clock component contained in the received Manchester code signal. On the other hand, signal "Clock" represents the clock component contained in the received signal, the component which is extracted by the PLL circuit of this embodiment. For use in an actual application, VCO 5 outputs signal "2CLK" which has a frequency two times higher than that of said clock component.

Charge pump 3 is comprised of the following: a first current source I2; a second current source I3; a third current source I1; a first switch SW2 which is connected to said first current source I2; a second switch SW3 which is connected to said second current source I3; a third switch SW1 which is connected to said third current source I1; and a low pass filter 21. Said first current source I2 charges up this pump, and said second current source I3 discharges this pump 3. On the other hand, third current source I1 charges up this pump 3 in order to correct the amount of said discharge by the second current source I3.

Figure 3:
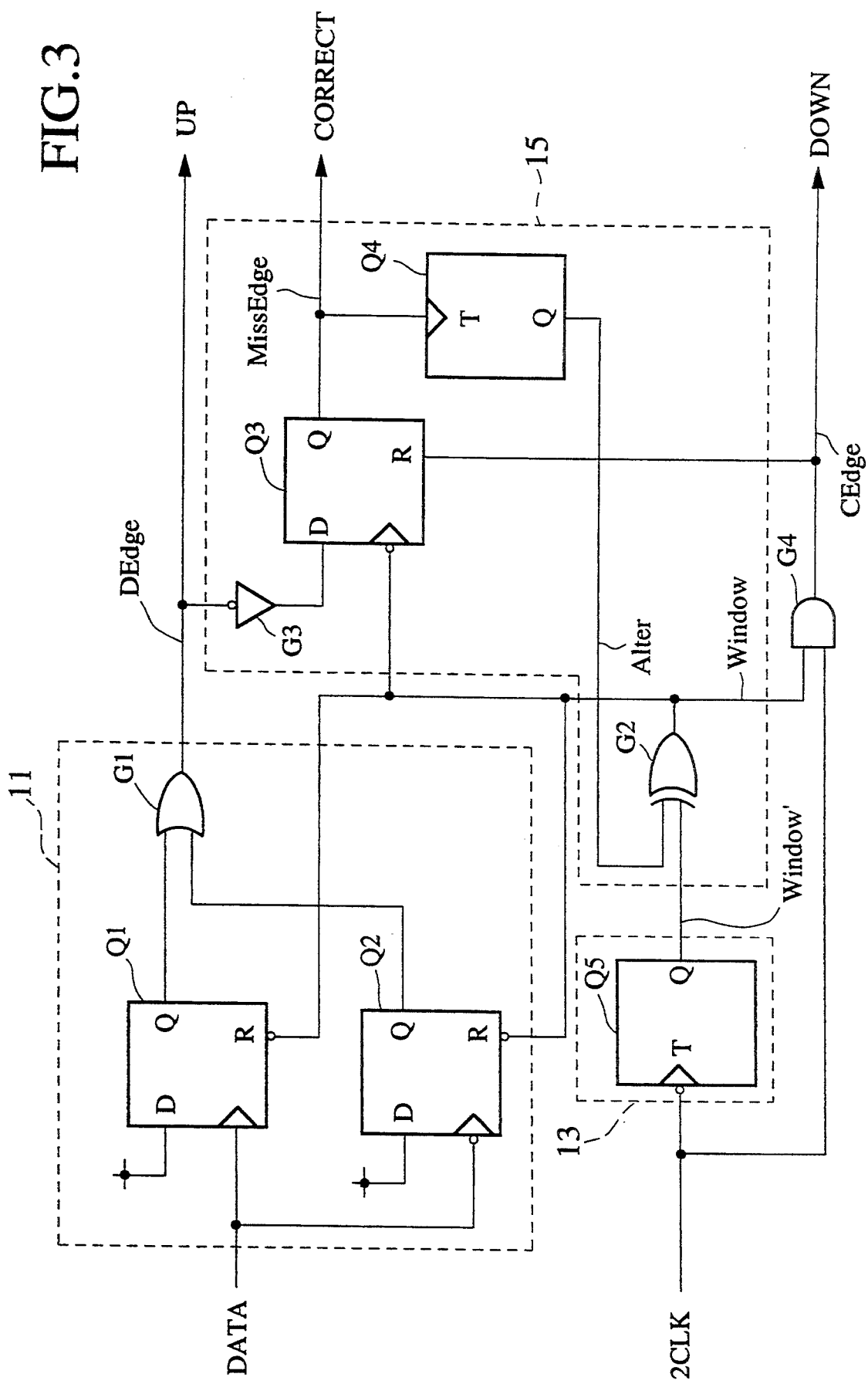
FIG. 3 is a circuit diagram showing the structure of the phase comparator which is included in the phase-locked loop circuit according to the first embodiment of the present invention.

FIG. 3 shows the detailed structure of phase comparator 1. As shown in this figure, phase comparator 1 is comprised of the following: a window signal generating means 13; an edge extracting means 11; and a control means 15. Said means 13 produces a window signal "Window'" which opens during from the first quarter to the third quarter of every information bit time of received data signal "DATA". Said means 11 extracts the edge of received data signal "DATA" during said open period of signal "Window'". According to the result from means 11, control means 15 finds whether the edge exists or not, and shifts the open period of signal "Window'" by a half time.

In FIG. 3, "UP", "DOWN", and "CORRECT" indicate the control signals which should be supplied to the switches connected to the current sources of charge pump 3. Signal "UP" controls the first switch SW2 of the first current source I2. Also, signal "DOWN" controls the second switch SW3 of the second current source I3, and signal "CORRECT" controls the third switch SW1 of the third current source I1.

Edge extracting means 11 receives data signal "DATA". Flip flop Q1 detects the rising edge of said data signal "DATA", and flip flop Q2 detects the falling edge of said data signal "DATA". These flip flops are in a reset state during the inactive state of signal "Window", which is obtained from gate G2 as described later. Therefore, these flip flops only extract the center edge of data signal "DATA", the edge which is generated during a window period. Two-input OR gate G1 takes the logical sum of the outputs from flip flops Q1 and Q2, thus producing a center edge extracting signal DEdge. This signal DEdge becomes control signal "UP" for controlling the first current source I2.

Window signal generating means 13 receives clock signal "2CLK". Flip flop Q5 in this means 13 divides the falling edge of clock signal "2CLK" into two parts, thus producing a signal "Window'" which is active during from the first quarter to the third quarter of one bit time.

On the other hand, in control means 15, NOT gate G3 inverts center edge extracting signal "DEdge" and sends the resulting signal into flip flop Q3. This flip flop Q3 samples the input signal at the rising edge of signal "Window" and produces a miss edge signal "MissEdge" which is to check whether the center edge of received data signal "DATA" has been detected or not at the end of the window period. This miss edge signal becomes the correct signal for controlling the third current source I1.

Flip flop Q4 executes a toggle operation by the rising edges of the miss edge signal. The output signal "Alter" from flip flop Q4 shifts the window position by a half bit time when the center edge is lost. XOR gate G2 executes an exclusive OR operation between signal "Alter" and signal "Window'", thus producing a signal "Window". In other words, gate G2 inverts signal "Window'", which is obtained by dividing the falling edge of clock signal "2CLK" into two, at every detection of the lack of center edge. Signal "Window'" is generated periodically in every bit period. Therefore, the inversion of signal "Window'" has the same result as the half bit shift of signal "Window'".

AND gate G4 takes the logical product between signal "Window" and clock signal "2CLK", thus producing a center edge predicting signal "CEdge" which stays active from the half to the third quarter of one bit time. This signal "CEdge" becomes signal "DOWN" for controlling the second current source I8.

Flip flop Q3, which produces signal "MissEdge", is reset by center edge predicting signal "CEdge". In other words, it is reset at the half bit time of the window period which arises just after the half bit shift of the signal "Window" by inverting the signal "Alter". As a result, the pulse width of the signal "CORRECT", which controls the third current source I1, becomes a quarter bit time.

Figure 4:
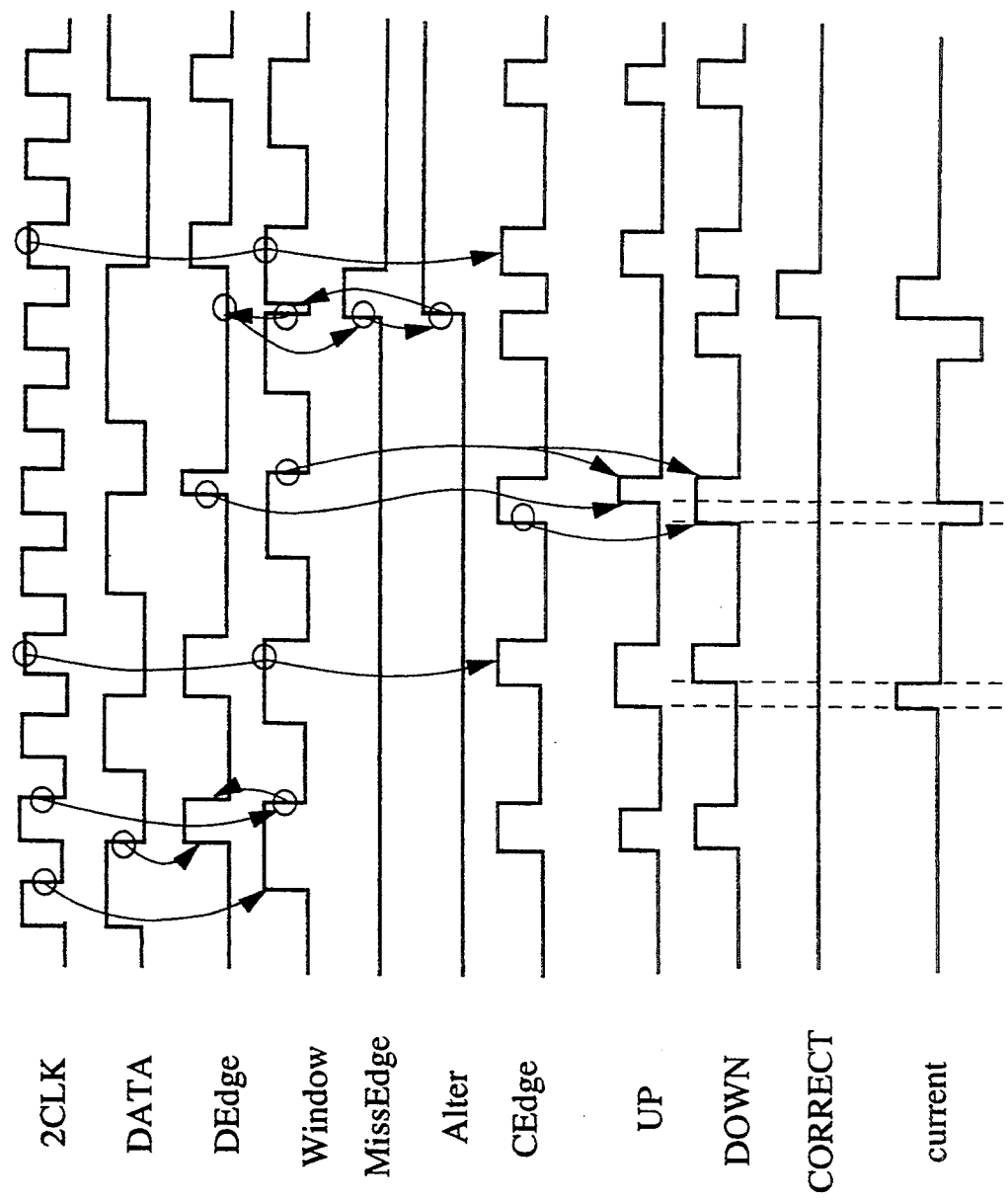
FIG. 4 is a timing chart for explaining the operation of the phase-locked loop circuit according to the first embodiment.

FIG. 4 is a timing chart for explaining the operation of the circuit of this embodiment.

As shown, signal "Window" arises synchronous with the falling edge of clock signal "2CLK". Center edge extracting signal "DEdge" is set by an edge of received data signal "DATA" which arises during the active state of signal "Window". On the other hand, center edge predicting signal "CEdge" extracts the clock signal "2CLK", which arises during the active state of signal "Window". Center edge extracting signal "DEdge" and center edge predicting signal "CEdge" respectively becomes control signal "UP" and "DOWN", each of which is reset when signal "Window" becomes inactive.

If there is an offset between the set times of control signals "UP" and "DOWN", a charging or discharging current "current" for charge pump 3 is produced in response to the offset. In the case where control signal "UP" is set first, the first current source I2 is driven first to generate a charging current for charge pump 3. Then, the second current source I3 is driven to discharge pump 3. As a result, the charging and the discharging currents from current source I2 and I3 become balanced and no current flows into or out of charge pump 3. If control signal "DOWN" is set first, current source I3 is driven to discharge pump 3 until the first current source I2 is driven.

If center edge extracting signal "DEdge" is not set during the window period, miss edge signal "MissEdge" is set at the falling edge of the window signal, allowing signal "Alter" to invert. As a result of this inversion, the window position shifts by a half bit, thus producing a new window period. The miss edge signal is reset by center edge predicting signal "CEdge" which is generated during the new window period.

When the miss edge signal occurs, control signal "CORRECT" is generated after the generation of control signal "DOWN", and thus, the discharge current caused by the second current source I3 is compensated with the current arising from the third current source I1. The signal "current" contains charging and discharging pulses, each of which has the same current amount and occurs successively as shown in FIG. 4.

Figure 5:
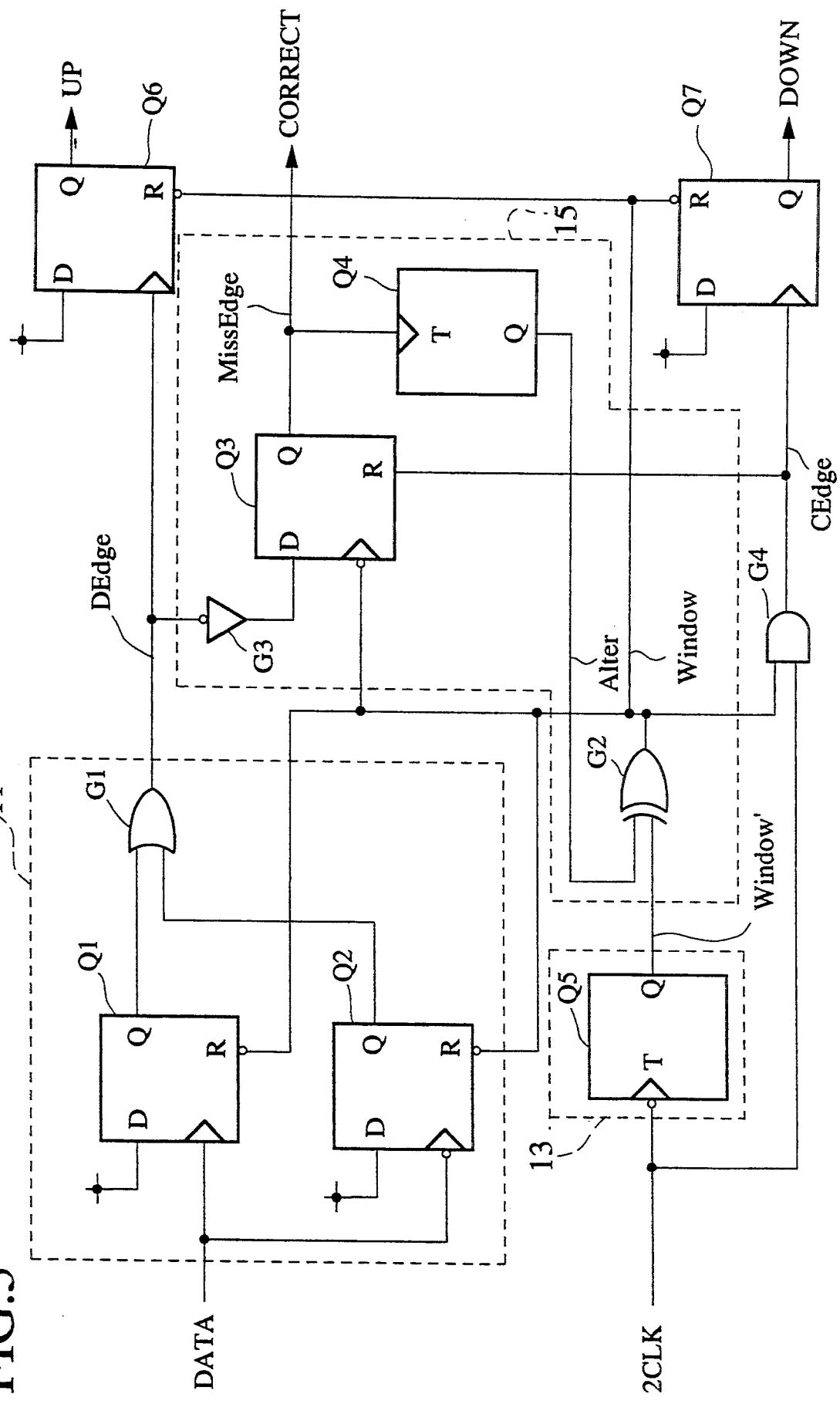
FIG. 5 is a circuit diagram showing the structure of a phase comparator which is included in the phase-locked loop circuit according to the second embodiment of the present invention.

Next, the second embodiment of the present invention will be described with reference to FIG. 5. In this figure, the structure of phase comparator 1 of the PLL circuit is shown according to the second embodiment. In addition to the structure of the PLL circuit according to the first embodiment, flip flops Q6 and Q7 are further provided in this embodiment so as to receive center edge extracting signal "Edge" and center edge predicting signal "Edge" as shown in the figure.

In the first embodiment, signals "UP" and "DOWN", which control the first current source I2 and the second current source I3, are both reset at the end of a window period. In this case, however, in the strict sense, center edge predicting signal "Edge" is reset slightly earlier than center edge extracting signal "Edge". This is because center edge predicting signal "Edge" contains only one delay caused by AND gate G4.

Both current sources I2 and I3 should be switched simultaneously from (on, on) to (off, off). In this embodiment, therefore, flip flops Q6 and Q7 are simultaneously reset using the inactive state of signal "window".

Figure 6:
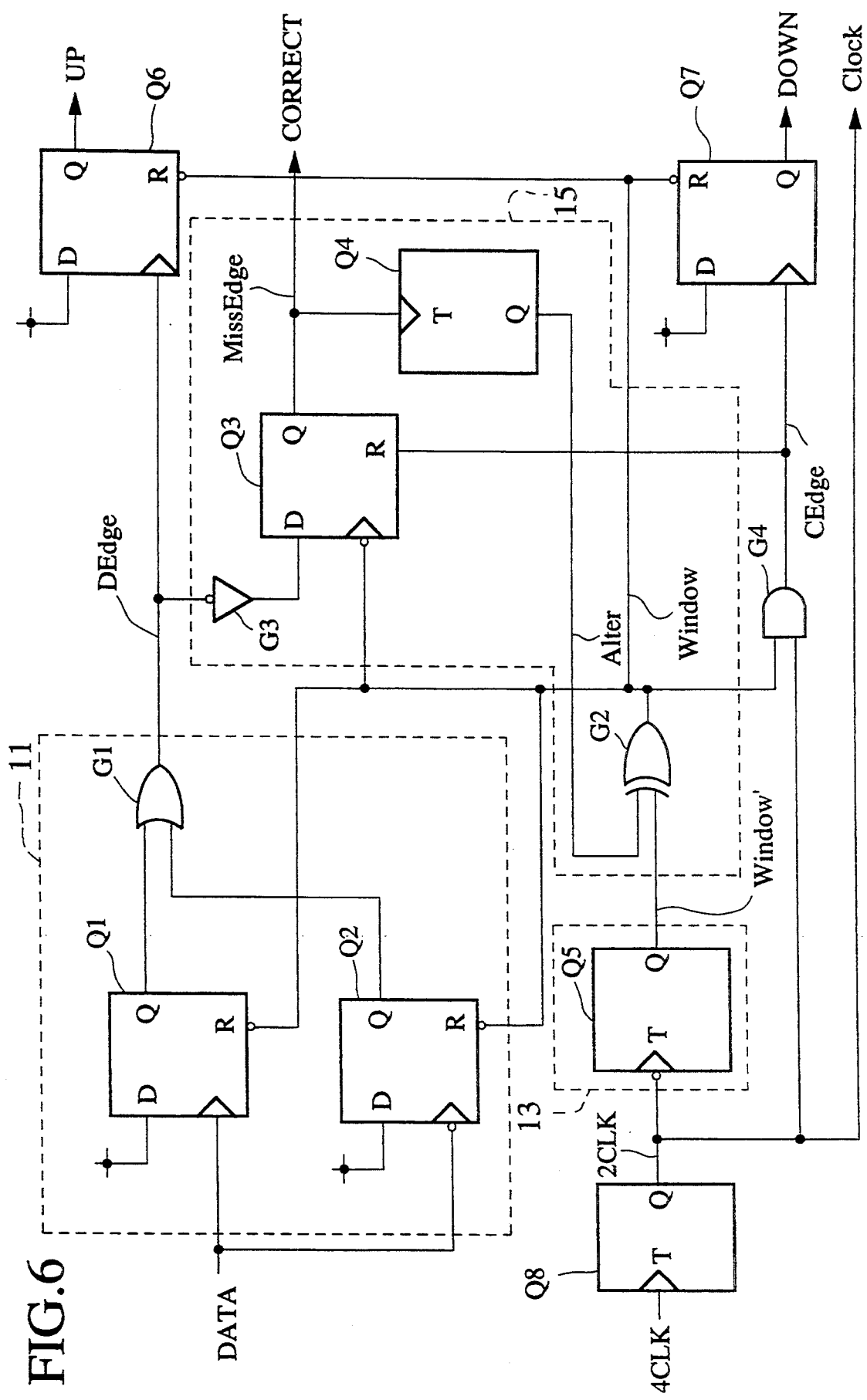
FIG. 6 is a circuit diagram showing the structure of a phase comparator which is included in the phase-locked loop circuit according to the third embodiment of the present invention.

Next, the third embodiment of the present invention will be explained with reference to FIG. 6. In this figure, the structure of phase comparator 1 included in a phase locked loop circuit is shown according to the third embodiment. In the first and second embodiments, the output frequency from VCO 5 is set to be two times as high as that of the clock signal contained in data signal "DATA". However, in the PLL circuit of the third embodiment, the output frequency from VCO 5 is set to be four times as high as that of the clock signal contained in data signal "DATA". In other words, the output signal from VCO 5 has a frequency 4CLK.

Window signal "Window" stays active during the time from the first quarter to the third quarter of one bit time. This signal is produced by dividing the falling edge of clock signal "2CLK" into two with flip flop Q5. If clock signal "2CLK" is directly generated by VCO 5 as described in the first and second embodiments, the duty ratio of VCO 5 must be precisely 50%. Otherwise, the window position will shift. In order to prevent this improper behavior, clock signal 4CLK is generated by VCO 5, and then, it is divided into two by flip flop Q8 so as to produce clock signal "2CLK". Thus, clock signal "2CLK" having 50% of precise duty ratio can be obtained.

Figure 7:
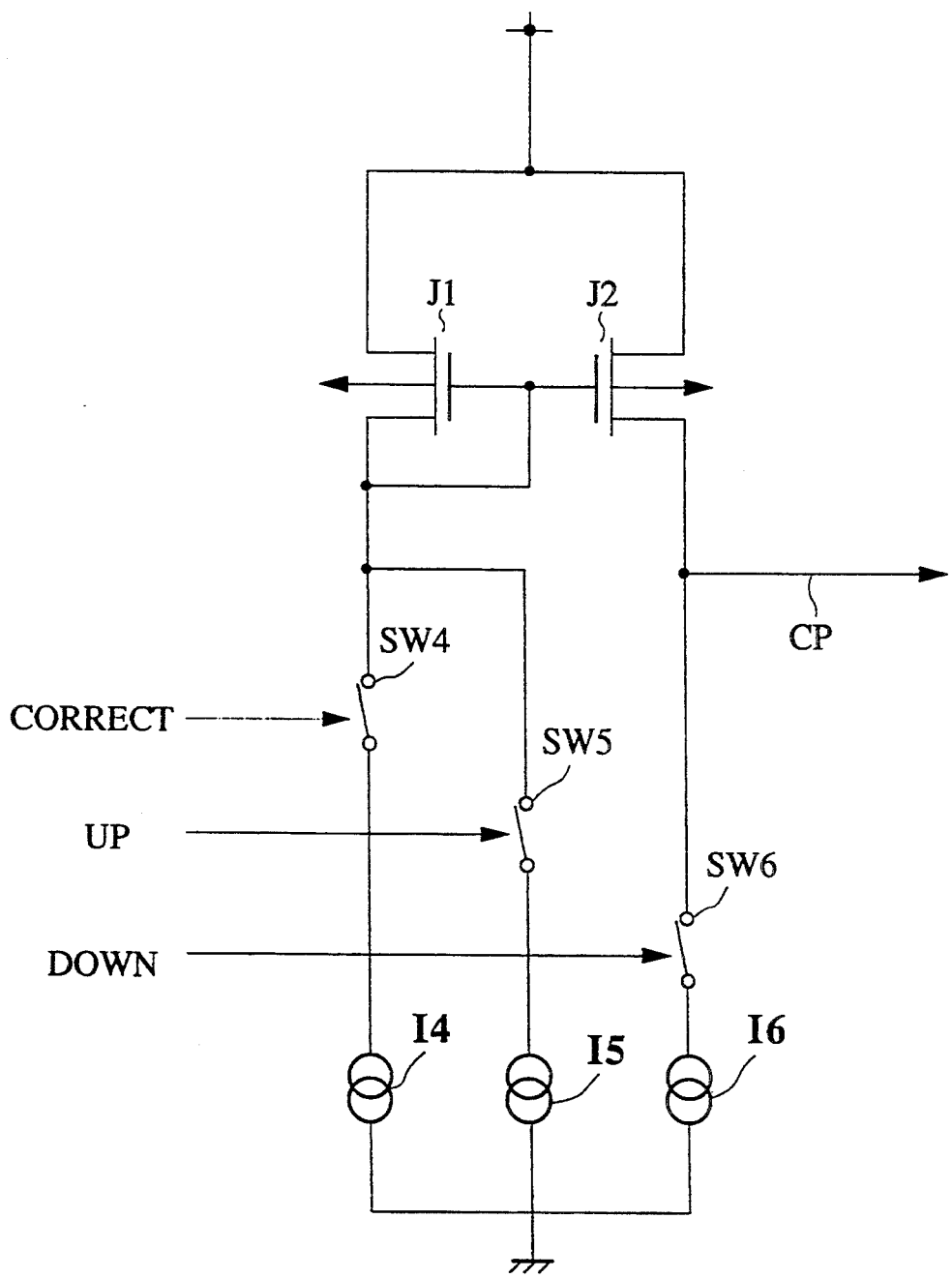
FIG. 7 is a circuit diagram showing the structure of the current source part and the charge pump contained in the phase-locked loop circuit according to the fourth embodiment of the present invention.

Next, the fourth embodiment of the present invention will be explained with reference to FIG. 7. In this figure, the structure of current sources in charge pump 3 included in the phase-locked loop circuit is shown according to the fourth embodiment. The PLL circuit of this embodiment is structured by replacing the current sources of the first, second and third embodiments with those of shown in FIG. 7.

It is very difficult to precisely coincide the characteristics of the charging current source with those of the discharging current source. Therefore, in this embodiment, all the current sources I4, I5, and I6 are constructed by discharging current sources. Using a current mirror circuit comprised of transistors J1 and J2, current sources I4 and I5 are made to operate as charging current sources. When a current generated from discharging current source I4 or I5, each of which should essentially operate as a charging current source, flows through transistor J1, another current having the same amount of current will occur in the transistor J2 side. This current flows into charge pump 3 as a charging current, and thus, switches SW4 and SW5 work as operation switches for controlling the charging current sources I4 and I5.

As explained above, in the first, second, third, or fourth embodiment, phase comparator 1 detects the phase difference between the center edge, which arises at least once at the same position in a signal wave corresponding to one bit data of Manchester code signal, and the edge in a signal produced by VCO 5 in PLL. Then, charge pump 3 produces a current having a magnitude corresponding to phase difference, so as to control the input voltage for VCO 5.

In a token ring network, signals having no center edge are used as a starting delimiter signal SD and an ending delimiter signal ED, each of which shows the start or the end of a frame. Therefore, even when the PLL circuit receives signals having no center edge, this circuit must follow up these signals. According to the invention, phase comparator 1 detects the lack of center edge and corrects the operation of charge pump 3 according to the detected result.

In order to connect a new station into a token ring network, or in order to disconnect a station from the ring, a relay switch is used for switching a circuit which connects the station with the ring. In this case, during a period that the relay switch turns on or off, no signal arises on the ring for a certain period.

In the first, second, third, and fourth embodiment, the lack of center edge is continuously detected during the period that no signal on "DATA" is found. Charge pump 3, therefore, repeats the compensating operation explained above. Due to this operation, however, the accumulated voltage in the loop filter connected to charge pump 3 gradually varies. As a result, once received signal "DATA" is again found, it is difficult for this PLL circuit to recover to the synchronous state.

In the fifth and sixth embodiments described below, new approaches are applied to overcome the above mentioned problem. One approach stops the operation of phase comparator 1 itself to cease the charge or discharge for the loop filter by charge pump 3, thus controlling the voltage variation. Another approach uses a clock signal whose oscillating frequency is selected to be the target frequency of this PLL circuit. This clock signal is input to phase comparator 1 instead of received data signal "DATA", so as to fix the oscillating frequency of VCO 5 to be the target value.

Figure 8:
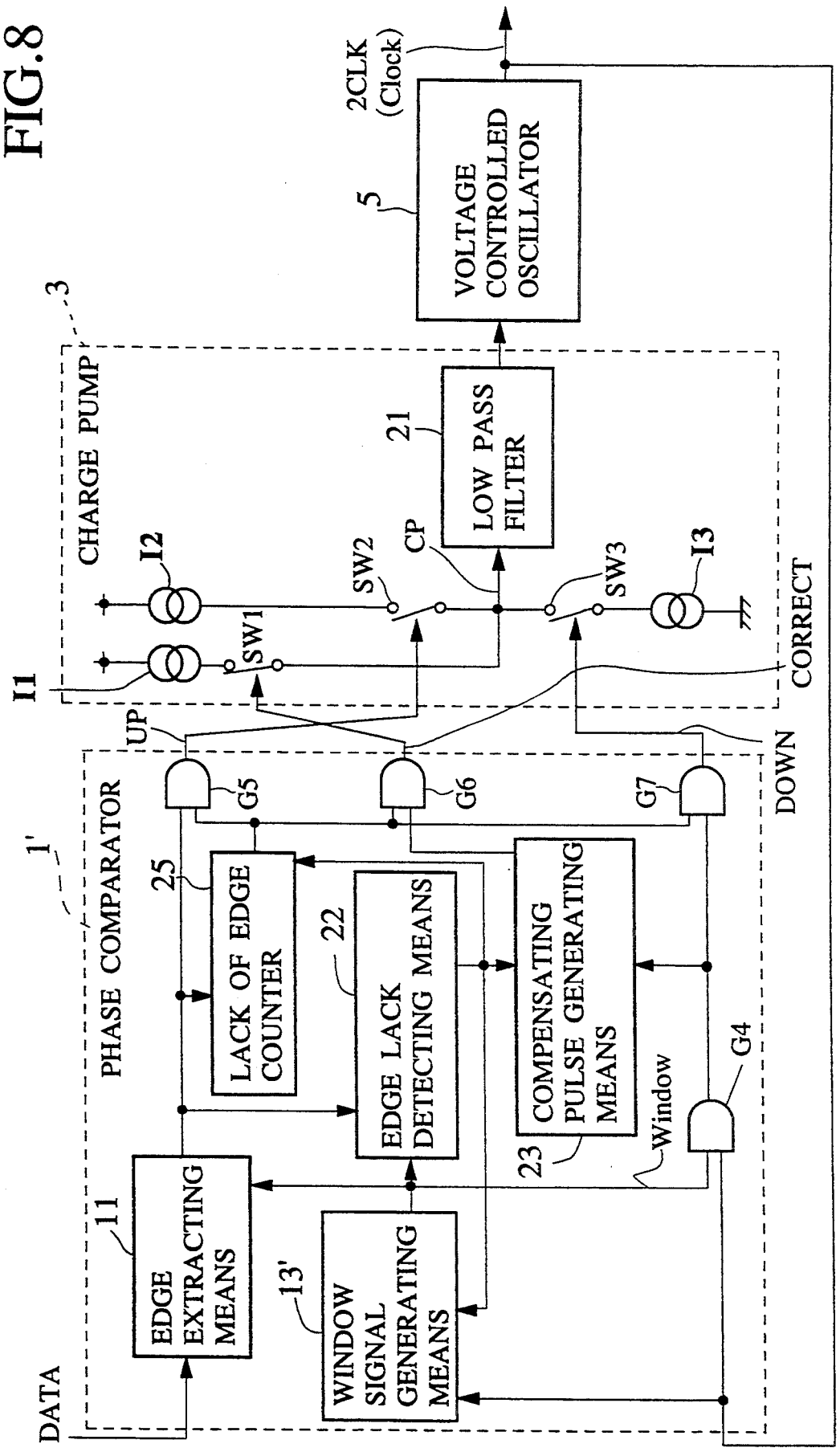
FIG. 8 is a circuit diagram showing the structure of a phase-locked loop circuit according to the fifth embodiment of the present invention.

In FIG. 8, the structure of a PLL circuit is shown according to the fifth embodiment of this invention.

As shown in this figure, the PLL circuit of this embodiment is comprised of the following: a phase comparator 1' for detecting the phase difference between received data signal "DATA" and clock signal "Clock"

obtained from VCO 5; a charge pump 3 for outputting a control voltage having a magnitude corresponding to said phase difference detected by phase comparator 1'; and VCO 5 for producing clock signal "Clock" according to said control voltage.

In this embodiment, signal "DATA" is composed of a differential Manchester code, and VCO 5 outputs signal "2CLK" which has a frequency two times as high as the bit speed of received data signal "DATA". Charge pump 3 has the same structure as that of the first embodiment.

Figure 9:
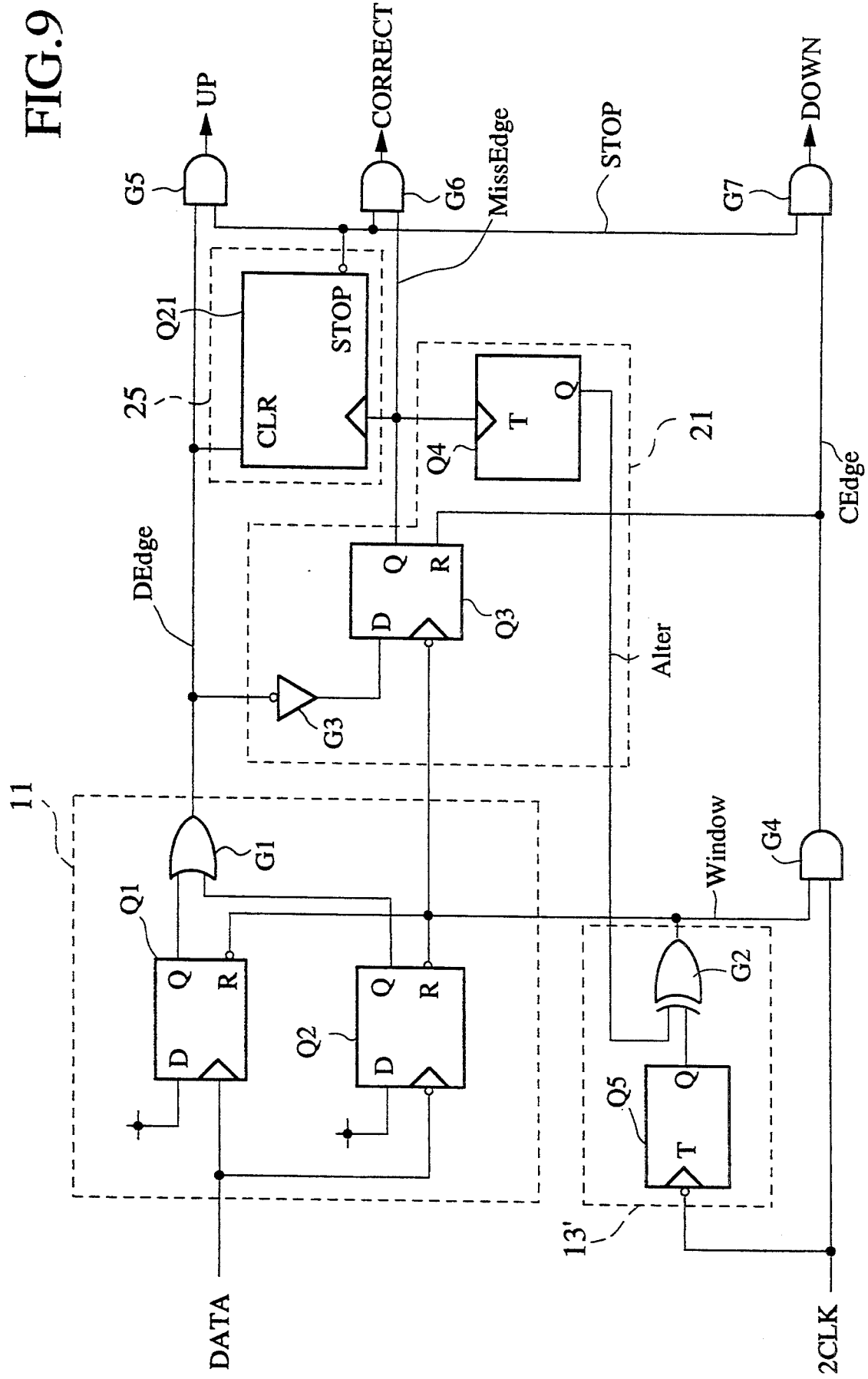
FIG. 9 is a circuit diagram showing the structure of a phase comparator which is included in the phase-locked loop circuit of the fifth embodiment.

In FIG. 9, the circuit structure of phase comparator 1' is shown according to this embodiment.

As shown in this figure, phase comparator 1' is comprised of the following: means 13' for generating a signal "Window" which opens during a certain period of every information bit time of received data signal "DATA"; means 11 for extracting an edge of received data signal "DATA" during said open period of signal "Window"; means 22 for detecting whether an edge arises or not, according to the result from edge extracting means 11; a compensating pulse generating means 23 for suppling charge pump 3 with a signal for correcting its operation; a lack of edge counter 25 for calculating the number of continuous lack of center edges detected by said means 22; and stopping means G5-G7 for ending the operation of phase comparator 1' when the counting value in said counter 25 reaches to a certain value, until a new edge is detected. In FIG. 9, lack of edge detecting means 22 and compensating pulse generating means 23 are combined into control means 21.

In window signal generating means 13', T type flip flop Q5 outputs signal "Window'" which is inverted at the first quarter bit time and the third quarter bit time. If necessary, this signal "Window'" is logically inverted to become signal "Window".

In edge extracting means 11, D type flip flops Q1 and Q2 extract the rising and falling edges of data signal "DATA" during a window period. The output of these flip flops Q1 and Q2 are input to two-input OR gate G1 so as to obtain center edge extracting signal "DEdge". This signal "DEdge" enters two-input AND gate G5 described later and becomes control signal "UP" for controlling charging current source I2.

Two-input AND gate G4 detects the rising edge of clock signal "2CLK", which arises during a window period, so as to produce a center edge predicting signal "CEdge". This signal "CEdge" enters two-input AND gate G7 described later and becomes control signal "DOWN" for controlling discharging current source I3.

NOT gate G3 and D type flip flop Q3 in means 22 and 23 (control means 21) produce miss edge signal "MissEdge" which shows there is no edge in data signal "DATA" at the end of the window period, that is, the lack of center edge. After passing through two-input AND gate G6 explained later, this signal becomes control signal "CORRECT" which controls the compensating operation of correcting current source I1.

T type flip flop Q4 supplies XOR gate G2 with inverted miss edge signal "MissEdge". Thus, above mentioned signal "Window'" is inverted so as to shift the active period of window signal by a half bit time.

By receiving miss edge signal "MissEdge", counter Q21 in lack of edge counter 25 calculates the number of the lack of a center edge in data signals "DATA". When the calculated number reaches a predetermined value, stop signal "STOP" becomes active.

When signal "STOP" comes into an active state, means G5-G7 comprised of two-input AND gates stop supplying the charge pump with center edge extracting signal "DEdge" (control signal "UP"), miss edge signal "MissEdge" (control signal "CORRECT"), and center edge predicting signal "CEdge" (control signal "DOWN"). This condition is not cancelled unless a new edge is extracted, that is, unless a new center edge extracting signal "DEdge" comes into an active state.

Figure 10:
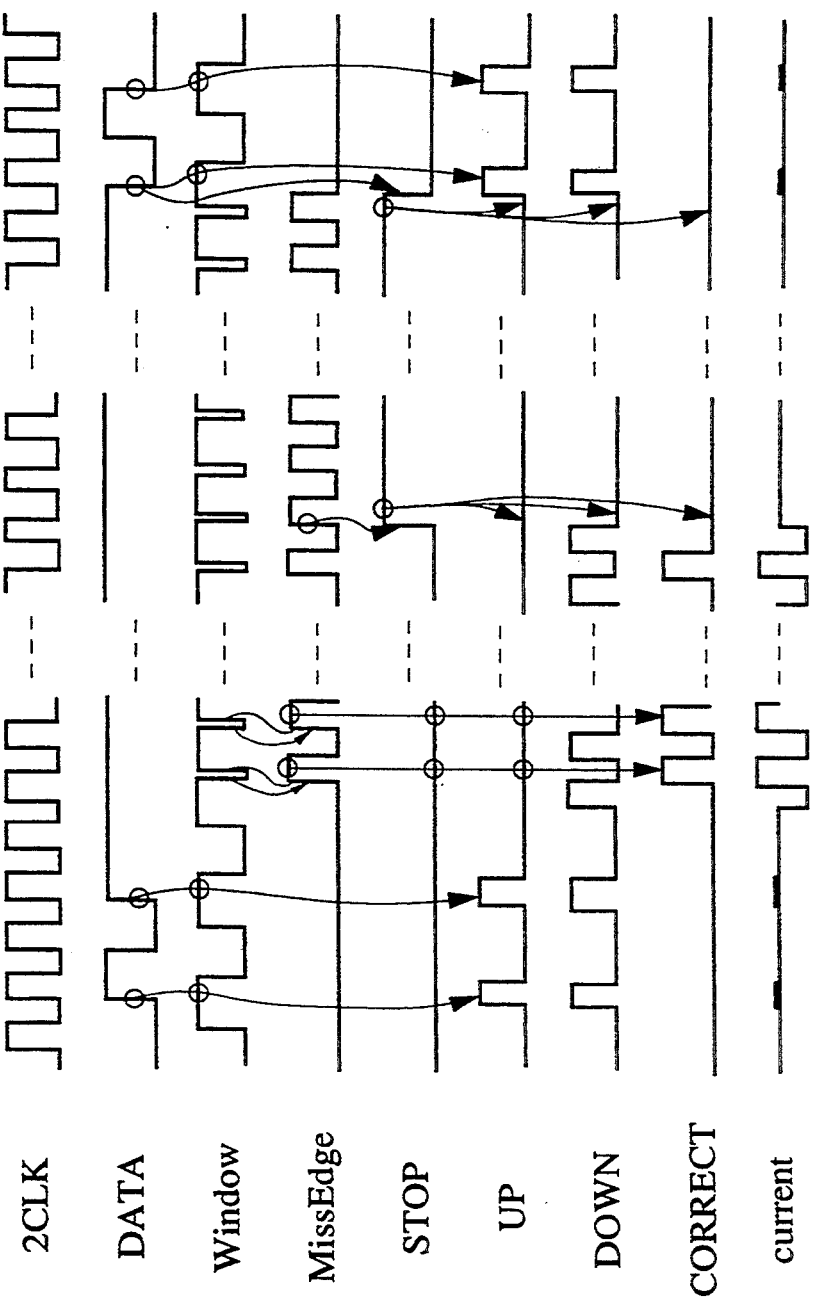
FIGS. 10a, 10b, and 10c are timing charts showing the operation of the phase-locked loop circuit of the fifth embodiment.

FIG. 10 is a timing chart for explaining the operation of this embodiment. FIG. 10a shows how control signal "CORRECT" is generated in order to correct the operation of charge pump 8 due to the center edge lack in a window period. FIG. 10b shows how the calculated number of counter 25 reaches to the predetermined value so as to set signal "STOP" to be active, thus stopping the supply of various control signals for the charge pump. FIG. 10c shows how a new edge is extracted so as to set signal "STOP" to be non-active, thus restarting the supply of various control signals for the charge pump.

In this embodiment, first current source I2, second current source I3 and third current source I1 in charge pump 3 produce discharging currents "current". In FIGS. 10a, 10b, and 10c, the heavy line shows that no current is coming and going because the currents from charging current source I2 and discharging current source I3 compensate for each other.

Figure 11:
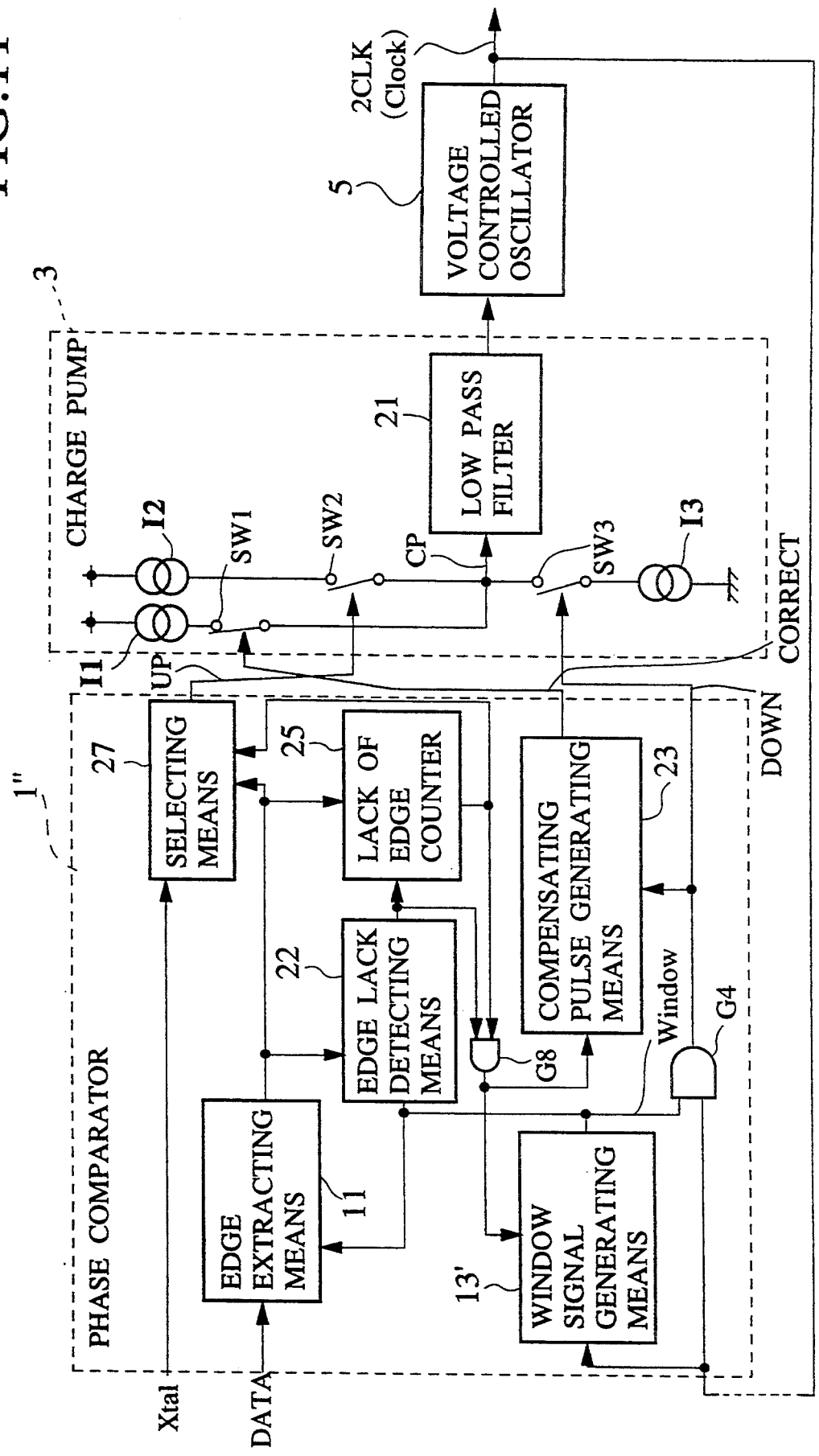
FIG. 11 is a circuit diagram showing the structure of a phase-locked loop circuit according to the sixth embodiment of the present invention.

Next, the sixth embodiment of this invention will be explained with reference to FIG. 11 which shows the structure of a PLL circuit of this embodiment.

As shown in this figure, the PLL circuit of this embodiment is comprised of the following: a phase comparator 1" for detecting the phase difference between received data signal "DATA" and clock signal "Clock" obtained by VCO 5; charge pump 3 for outputting a control voltage having a magnitude corresponding to the phase difference detected by phase comparator 1"; and VCO 5 for producing clock signal "Clock" according to said control voltage.

In this embodiment, signal "DATA" is a differential Manchester code signal received from a token ring. Also, signal "2CKL" has an oscillating frequency two times as high as the bit speed of received data signal "DATA", and is obtained from VCO 5. Charge pump 3 has the same structure as that of the first embodiment.

Figure 12:
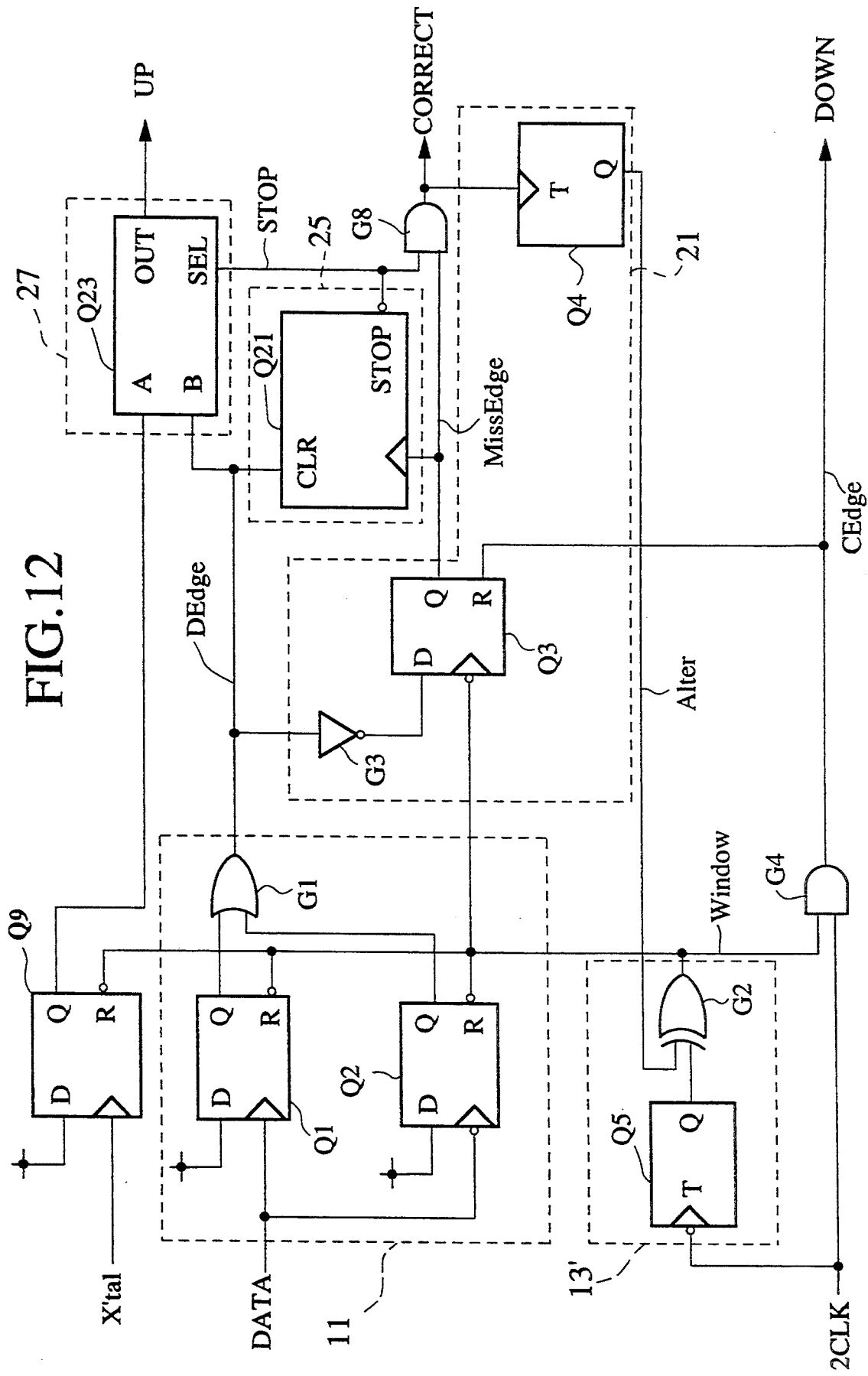
FIG. 12 is a circuit diagram showing the structure of the phase comparator which is included in the phase-locked loop circuit of the sixth embodiment.

In FIG. 12, the circuit structure of phase comparator 1" is shown according to this embodiment.

As shown in this figure, phase comparator 1" is comprised of the following: window signal generating means 13' for producing signal "Window" which opens for a certain period of every information bit time of received data signal "DATA"; edge extracting means 11 for detecting the edge of received data signal "DATA" during said open period of signal "Window"; lack of edge detecting means 22 for finding whether the edge arises or not according to the result from said means 11; compensating pulse generating means 23 for outputting a signal, which is to correct the operation of charge pump 3, when a lack of edge is detected by said means 22; counter 25 for calculating the detection number of continuous lack of the edge detected by said means 22; and selecting means 27 for changing the input signal of phase comparator 1" with signal X'tal having a predetermined value of frequency, when the value in counter 25 reaches to a predetermined value and until a new edge is detected. In FIG. 12, means 22 and means 23 are united and shown as control means 21.

The operations of window signal generating means 13', edge extracting means 11, two-input AND gate G4, edge lack detecting means 22, compensating pulse generating means 23, and lack of edge counter 25 are the same as those in the fifth embodiment.

D type flip flop Q9 detects the rising edge of signal X'tal which arises during a window period, and produces a signal which is active during the window period.

When the value in counter Q21 reaches to the predetermined value, and thus signal "STOP" is set to be active, two-input data selecter Q23 in selecting means 27 switches over control signal "UP" supplied to current source I2 to the other signal which is extracted from the center edge of signal X'tal, instead of data signal "DATA".

When the value in counter Q21 reaches the predetermined value, and thus signal "STOP" is set to be active, two-input AND gate G8 does not supply current source I1 with control signal "CORRECT" any more, so as to cease the compensating operation. In addition, when signal "STOP" is set to be active, T type flip flop Q4 prevents the window period to shift.

Figure 13:
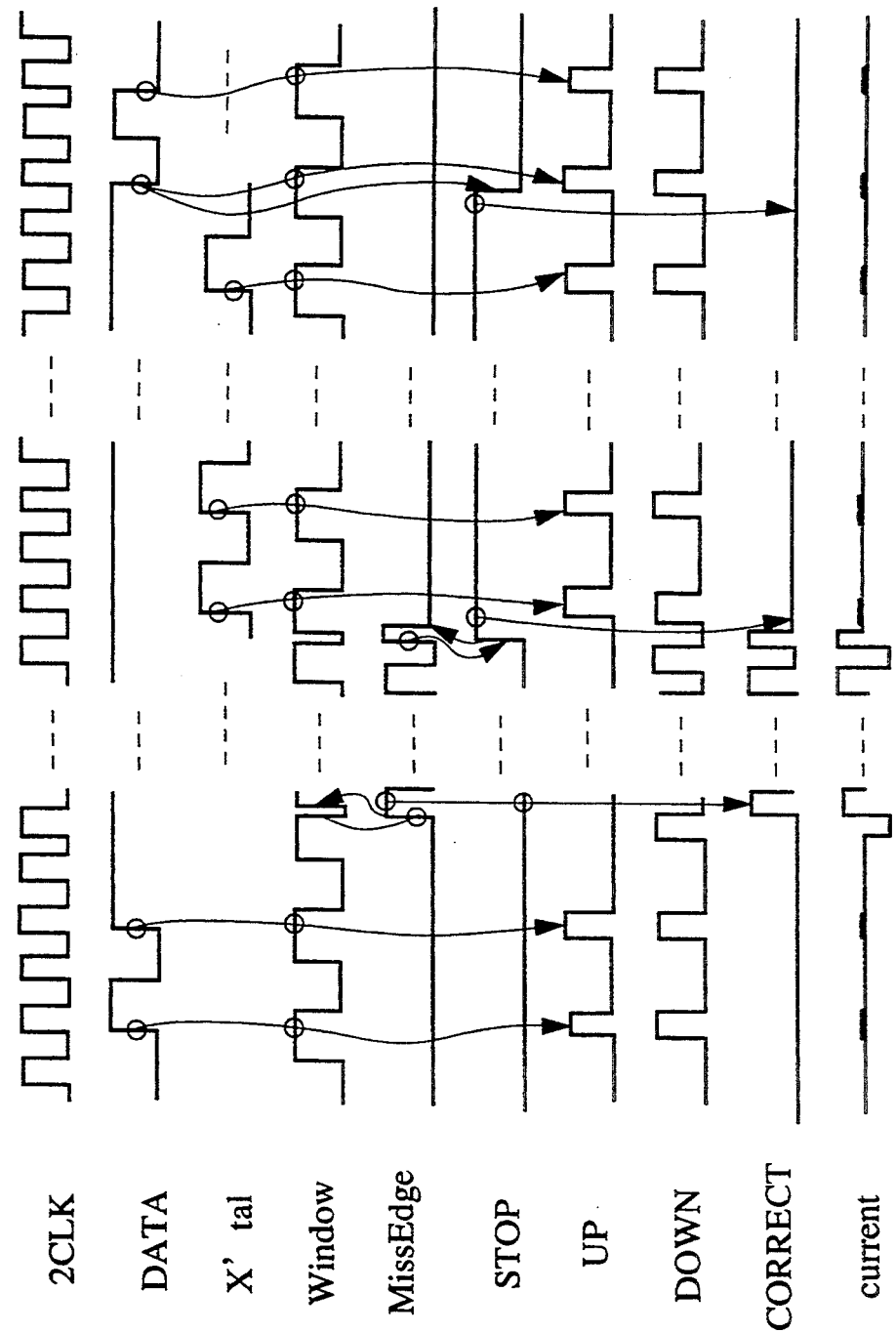
FIGS. 13a, 13b, and 13c are timing charts showing the operation of the phase-locked loop circuit of the sixth embodiment.
Figure 14:
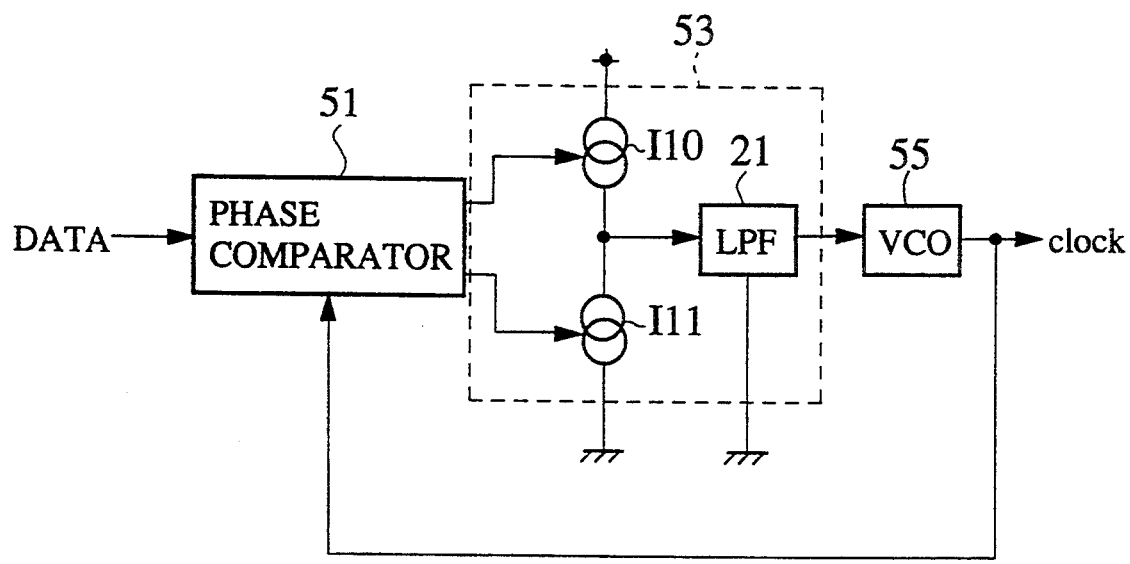
FIG. 14 is a circuit diagram showing the structure of a phase-locked loop circuit according to one prior art of the present invention.
Figure 15:
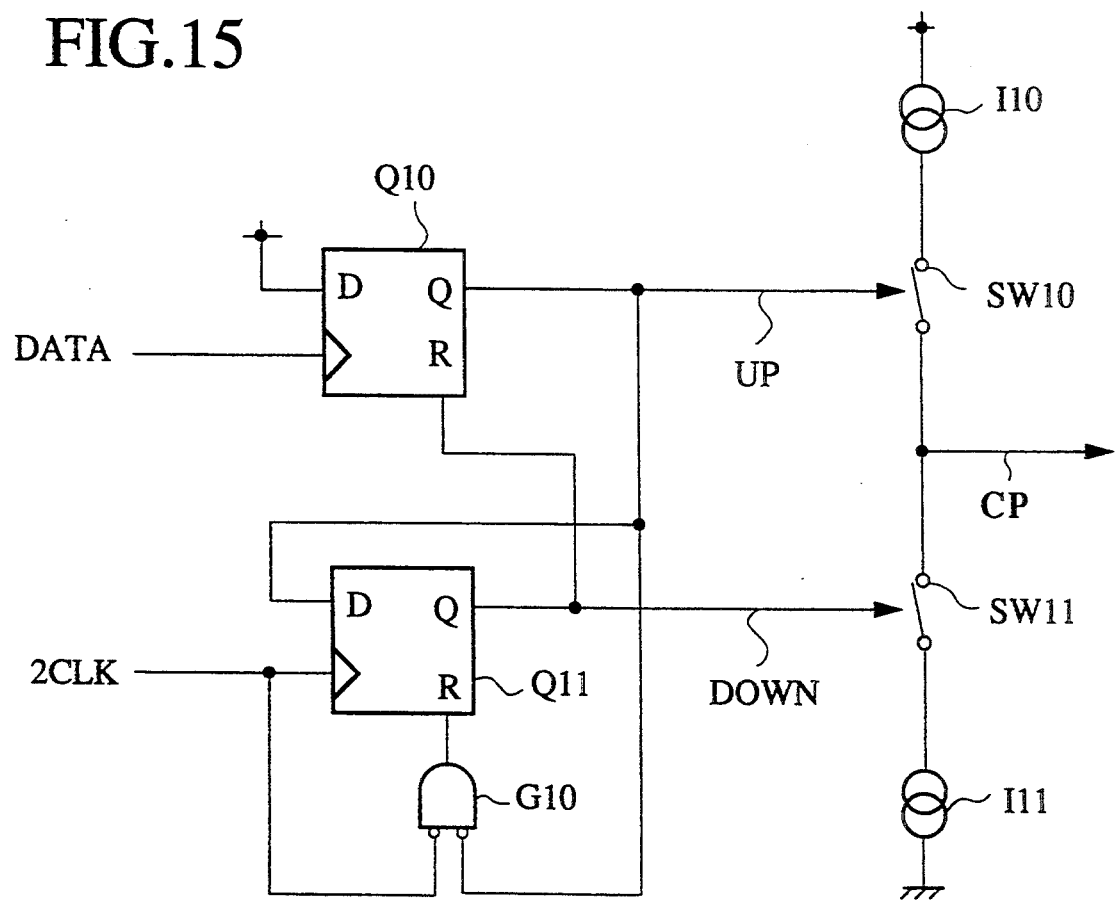
FIG. 15 is a circuit diagram showing the structure of the phase comparator and the charge pump of the prior art phase-locked loop circuit.
Figure 16:
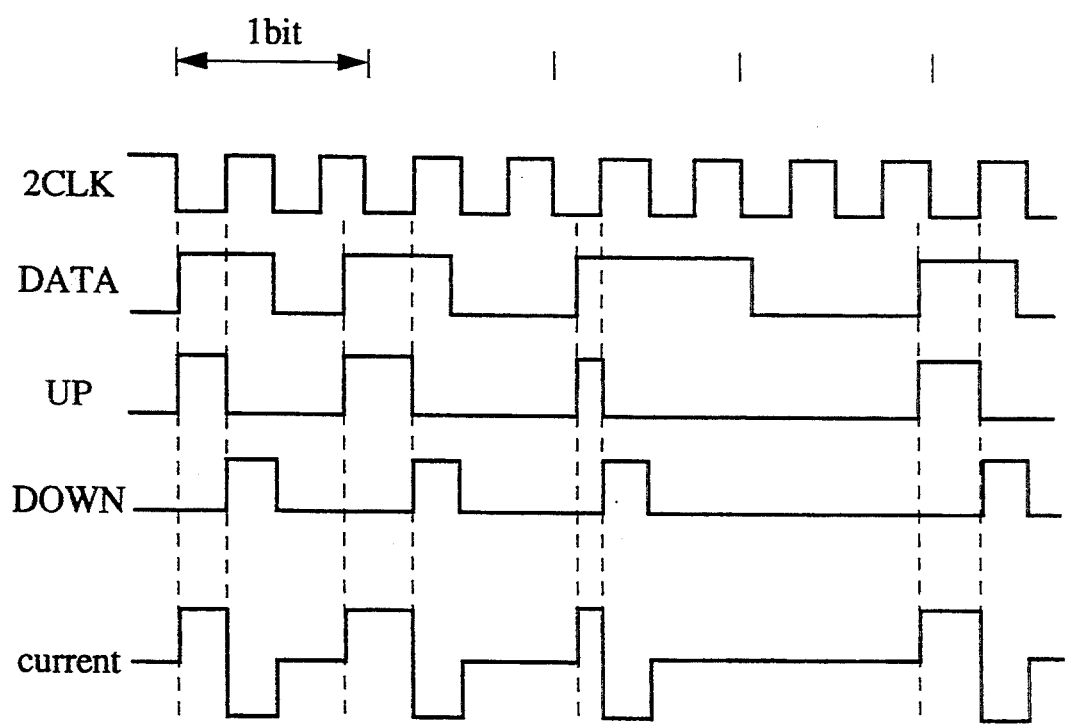

In FIGS. 13a–13c, timing charts are shown in order to explain the operation of this embodiment. FIG. 13a shows how control signal "CORRECT" is produced in order to compensate the wrong operation of charge pump 3, after having detected the lack of center edge in a window period. FIG. 13b shows how the value of counter 25 reaches to the predetermined value, signal "STOP" is set to be active, control signal "UP" is produced based on the center edge detected from signal X'tal, the supply of signal "CORRECT" for current source I1 is stopped, and thus no shift is applied to the window period. Further, FIG. 13c shows how a new edge is detected from data signal "DATA", signal "STOP" is set to be non-active, and thus the PLL circuit recovers to the original state.

In the same manner as the first embodiment, the second, third, and fourth embodiments can be applied to the fifth and sixth embodiments.

In summary, according to the PLL circuit having the first, fourth, fifth, sixth, eighth, ninth, or tenth feature, a window signal, which opens during from the first quarter to the third quarter of every one information bit time of received data, is produced by a phase comparator. An edge extracting means finds the existence of an edge in the received data signal during the open period of the window. As a result, an edge, which exists during a period from the first to the third quarter of one bit time, can be detected as a center edge, even it has a phase Jitter arising in said window period, that is, from the first to the third quarter of one bit time. If such a center edge does not exist in the window period and a phase comparison can't be carried out, control means detects the lack of center edge according to the result from edge detecting means, and shifts the window position by a half bit time so as to carry out a new center edge extraction. So, in a token ring network using a differential Manchester code and in various LANs using Manchester code, this invention can provide a PLL circuit which is capable of recovering to a synchronous state without causing a bit slip, even when a center edge is lost.

In the case where no center edge is found during the window period, the third current source in a charge pump produces a charging current for compensating a discharge, according to the detected result from edge extracting means. Also, the first switch connected to the first current source and the second switch connected to the second current source are controlled to be (off, off), (on, off), (on, on), and (off, off), or, (off, off), (off, on), (on, off), and (off, off) in turn. As a result, the 'on' period of each switch becomes longer, thus stabilizing the operation of current sources. Further, in the case where the two current sources for charging and discharging are both in an on state, the inflow and outflow of currents for the charge pump are arranged reach to the equilibrium state. Thus, in the same manner as is the case where both switches are in an off state, the charge pump is controlled to have no charge increase or decrease. So, this invention can provide a PLL circuit having a stable flow-up speed for all data patterns.

In addition, when the lack of center edge is continuously detected, the PLL circuit having the second, fourth, fifth, sixth, eighth, ninth, or tenth feature stops the operation of the phase comparator itself, so as not to charge or discharge the loop filter by the charge pump. As a result, the voltage variation in the voltage controlled oscillator can be controlled effectively. So, this invention provides a PLL circuit which is capable of reducing the time required to recover to a synchronous state once a Manchester signal is again received.

Still in addition, when the lack of center edge is continuously detected, the PLL circuit having the third, fourth, fifth, sixth, seventh, eighth, ninth, or tenth feature fixes the oscillating frequency of the voltage controlled oscillator to its target value, by inputting a clock signal having said target frequency into the phase comparator as a received data signal. As a result, the voltage variation in the voltage controlled oscillator can be controlled effectively. So, this invention provides a PLL circuit which is capable of reducing the time required to recover to the synchronous state once a Manchester signal is again received.

What is claimed is:

1. A phase-locked loop circuit comprising:
   a voltage controlled oscillator for receiving a control voltage and generating a clock signal proportional to said control voltage;
   a phase comparator connected to said voltage controlled oscillator for detecting a phase difference between a received data signal and said clock signal obtained from said voltage controlled oscillator;
   a charge pump connected to said voltage controlled oscillator for supplying said control voltage to said voltage controlled oscillator and including a charging circuit for charging a node and a discharging circuit for discharging said node, said control voltage being varied in accordance With a voltage at said node;
   said phase comparator including:
   (a) means for generating a window signal which opens during a predetermined period of every one information bit;
   (b) means connected to said charge pump for extracting an edge of said data signal during said predetermined period of said open window signal and outputting to said charge pump a first signal activated when said edge is extracted and deactivated when said window signal is closed, said charging circuit being activated by said first signal;
   (c) means connected to said charge pump for outputting a second signal activated in synchronism with said clock signal and deactivated when said window signal is closed, said discharging circuit being activated by said second signal;

(d) means connected to said extracting means for outputting a third signal outputted when no edge is extracted during said predetermined period, said charging circuit being activated by said third signal to compensate discharge by said discharging circuit.

2. The phase-locked loop circuit as claimed in claim 1, wherein said means for outputting said first signal outputs said first signal through a first flip-flop and said second signal outputting means outputs said second signal through a second flip-flop, and said first and second flip-flops are reset by an inverted signal of said window signal respectively.

3. The phase-locked loop circuit as claimed in claim 1, wherein said voltage controlled oscillator generates said clock signal through a frequency dividing circuit.

4. The phase-locked loop circuit recited in claim 1, further comprising a lack of edge counter connected to said extracting means and said second signal outputting means for counting the number of continuous openings of said window signal in which no edge is extracted and for masking said first, second, and third signals when said number of continuous openings exceeds a predetermined number.

5. The phase-locked loop circuit recited in claim 1, further comprising:
an auxiliary signal generating circuit for generating an auxiliary signal at a predetermined frequency;
a lack of edge counter connected to said extracting means and said third signal outputting means for counting the number of continuous opening of said window signal in which no edge is extracted; and
a selector connected to said auxiliary signal, said extracting means and said lack of edge counter for outputting said auxiliary signal in place of said first signal when said number counted by said lack of edge counter reaches a predetermined number.

6. The phase-locked loop circuit recited in claim 1 wherein said charge pump includes a mirror circuit; said charging circuit includes a first portion and a second portion, said first portion comprising a first switch and a first current source connected between said mirror circuit and ground, said first switch being controlled by said first signal, said second portion comprising a second switch and a second current source connected between said mirror circuit and ground, said second switch being controlled by said third signal; said discharging circuit includes a third switch and a third current source connected between said node and ground, said third switch being controlled by said second signal; and said charging circuit is coupled with said node through said mirror circuit.

7. The method recited in claim 1 wherein said predetermined period is about one-half of a period of said bit.

8. The method recited in claim 7 wherein said predetermined period begins after about one quarter of the duration of said predetermined bit period and extends to about three-quarters of said duration of said predetermined bit period.

9. A phase-locked loop circuit comprising:
a voltage controlled oscillator for receiving a control voltage and generating a clock signal proportional to said input voltage;
a charge pump connected to said voltage controlled oscillator for supplying said control voltage to said voltage controlled oscillator and including a charging circuit for charging a node and a discharging circuit for discharging said node, said charging circuit being driven by a first signal, said discharging circuit being driven by a second signal, said control voltage being varied in accordance with a voltage at said node;
a window generating circuit for generating a window pulse signal from said clock pulse, the pulse width of said window pulse signal being substantially a half of a pulse width corresponding to one bit information of a received data signal;
a first signal generating circuit connected to said charge pump for receiving said data signal, extracting an edge of said data signal when said window signal is active and outputting said first signal to said charge pump, said first signal being activated between said extracted edge and one of edges of said window pulse signal;
a second signal generating circuit connected to said discharge pump for outputting said second signal to said charge pump, said second signal being activated between said one edge of said clock pulse and said one of edges of said window pulse signal within every information bit of said received data signal in order that said first and second signal are coincident with each other when there is no phase difference between said clock signal and said received data signal.

10. A method of extracting a clock component out of a multi-bit received signal in a phase-locked loop, the method comprising the steps of:
generating a clock signal in a voltage controlled oscillator in response to a control voltage, said control voltage being varied in accordance with a voltage at a node;
detecting a phase difference between said clock signal from said voltage controlled oscillator and said received signal, said detecting step further comprising:
i) generating a window signal having an open state from a predetermined period of each bit of said multi-bit received signal;
(ii) during said open state outputting a first signal when an edge of said multi-bit received signal is detected and outputting a second signal synchronous with said clock signal;
(iii) charging said node in response to said first signal and discharging said node in response to said second signal; and
(iv) if no first signal is generated during said predetermined period, charging said node to compensate for discharge of said node by said second signal.

11. A phase-locked loop circuit comprising:
a voltage controlled oscillator for receiving a control voltage varied in accordance with a voltage at a node and generating a clock signal proportional to said control voltage;
a charge pump connected to said voltage controlled oscillator for supplying said control voltage to said voltage controlled oscillator through a filter circuit and including a charging circuit for charging said node and a discharging circuit for discharging said node, said charging circuit being driven by a first signal, said discharging circuit being driven by a second signal;

a window generating circuit for generating a window pulse signal from said clock pulse, the pulse width of said window pulse signal being substantially a half of a pulse width corresponding to one bit information of a received data signal;

a first signal generating circuit connected to said charging circuit for receiving said data signal, extracting an edge of said data signal and outputting said first signal when said window signal is active;

a second signal generating circuit connected to said discharging circuit for outputting said second signal to said charge pump, wherein a period during which said first signal is activated overlaps a period during which said second signal is activated.

12. The phase-locked loop circuit recited in claim 11 further comprising means for compensating discharge performed by said discharging circuit when no edge is detected with said window signal being opened.

* * * * *